United States Patent [19]

Chen et al.

[11] Patent Number: 5,739,059

[45] Date of Patent: Apr. 14, 1998

[54] METHOD OF FORMING A SEMICONDUCTOR DEVICE HAVING HIGH AND LOW RESISTANCE POLYSILICON

[75] Inventors: Hsin-Pai Chen, Hsinchu; Yen-Lung Chiu, Hua Lian Hsien, both of Taiwan

[73] Assignee: Taiwan Semiconductor Manufacturing Co., Ltd., Hsinchu, Taiwan

[21] Appl. No.: 841,844

[22] Filed: May 5, 1997

[51] Int. Cl.[6] .................................................. H01L 21/8234
[52] U.S. Cl. .................... 438/238; 438/385; 438/527; 438/529; 438/532; 438/914
[58] Field of Search .............................. 438/238, 385, 438/527, 529, 532, 914

[56] References Cited

U.S. PATENT DOCUMENTS 4,592,128  6/1986  Bourassa ........................... 438/238
4,859,278  8/1989  Choi ................................... 438/238
5,246,876  9/1993  Manning ............................ 438/238
5,514,617  5/1996  Liu ..................................... 438/238
5,620,922  4/1997  Yoshida et al. ................... 438/238

*Primary Examiner*—Charles L. Bowers, Jr.
*Assistant Examiner*—Lynne A. Gurley
*Attorney, Agent, or Firm*—Christensen, O'Connor, Johnson & Kindness PLLC

[57] ABSTRACT

The present invention is a method of manufacturing a high/low resistance on a mix-mode product. The method includes forming a polysilicon layer over a wafer. A blanket ion implantation is performed to implant ions into the entire polysilicon layer. The polysilicon layer is then separated into a high resistance area and a low resistance area. The low resistance area top surface is raised higher than the high resistance area. A photoresist is then formed on the polysilicon areas. The photoresist is subsequently etched back to the top surface of the low resistance areas. A second implant is done on the low resistance area.

15 Claims, 5 Drawing Sheets ns. 5,739,059

METHOD OF FORMING A SEMICONDUCTOR DEVICE HAVING HIGH AND LOW RESISTANCE POLYSILICON

FIELD OF THE INVENTION

The present invention relates to a method of forming polyload, and more specifically, to a method of making a device having high resistance polyload and low resistance polyload.

BACKGROUND OF THE INVENTION

Great progress has been made in the manufacture of integrated circuits using high density semiconductor technology. In the formation of integrated circuits, the sizes of devices has gotten smaller and smaller such that the area available for a device has become very small. In order to achieve high density in a wafer, devices or memory cells, such as DRAM, must be scaled down to the submicron range. Thus, as the capacity of a wafer has increased, the size of the devices must steadily decrease. The reduction in memory cell area is required for high density DRAMs.

Further, there may be hundreds of separate process steps in fabricating a chip. The formation of the chip is not only a complicated task but also a challenge. Thus, it has been a trend to reduce the number of process steps needed to form a product. Polysilicon is one of the most widely used materials in the field of forming integrated circuits. Typically, it is used to form a conductive element of a device, such as a gate electrode of a transistor. In addition, it is also utilized to serve a resistor in the formation of integrated circuits. Polysilicon used for this purpose is referred to as a polyload.

Polyload can be made to be either high resistance or low resistance. An integrated circuit that includes both types is referred to as a mix-mode products. A mix-mode product is one that has areas of different resistance. It is often used to implement analog circuits. Typically, a mix mode product will have one area of low resistivity (40 ohms/square) and another area of high resistivity (2000 ohms/square). Currently, prior art methods require additional extra masking steps to produce the high and low resistance polysilicon on the mix-mode products.

A prior art method of forming mix-mode products is described below. In some cases, a conductive layer and a polyload have to be formed in related processes. As shown in FIG. 1, a single crystal substrate 2 with a <100> crystallographic orientation is used. An isolation layer 4 is formed on the substrate 2. A first polysilicon layer 6 is patterned to form a conductive element of a device. Then, a second isolation layer 7 is formed on the first polysilicon layer 6. A second polysilicon layer 8 is subsequently deposited over the isolation layer 7 to a thickness of about 2700 angstroms. Then, a silicon oxide layer 10 is deposited on the second polysilicon layer 8 by using plasma enhanced chemical vapor deposition.

Turning to FIG. 2, a photoresist 11 is patterned on the silicon oxide layer 10. Turning to FIG. 3, the silicon oxide layer 10 is etched to form a cap oxide 10 using the photoresist 11 as an etching mask. Then, the photoresist 11 on the cap oxide 10 is stripped away.

Next, turning to FIG. 4, an ion implantation is used to dope ions into a portion of the second polysilicon layer 8a using the cap oxide 10 as an implantation mask. The polysilicon layer region 8a will serve as a low resistance polysilicon region 8a. The dosage of the ion implantation is about 1E15 atoms/cm$^2$. The energy of the implantation is about 80 KeV.

Turning to FIG. 5, the cap oxide 10 is removed by dry etching. Then, a second ion implantation is utilized to implant ions into the second polysilicon layer 8. Therefore, a high resistance polysilicon layer region 8b and a low resistance polysilicon region 8a are simultaneously created. The dosage of the second ion implantation is about 1E14 atoms/cm$^2$. The energy of the second implantation is about 80 KeV.

Turning to FIG. 6, the polysilicon layer regions 8a, 8b are separated using a photolithography and etching processes. Thus, the low resistance polysilicon 8a and high resistance polysilicon 8b are formed.

Yet an even simpler prior art method is described below. Turning to FIG. 7, an isolation layer 14 and a first polysilicon layer 16 are formed on a substrate 12, the first polysilicon 16 to a thickness of about 2700 angstroms. Then, a second polysilicon layer 18 and a second isolation layer 17 are respectively deposited over the isolation layer 14. Next, a first photoresist layer 20 is patterned on a portion of the first polysilicon layer 18 to expose a portion of the polysilicon where will be used as a high resistance polysilicon region.

Turning to FIG. 8, a first ion implantation is performed using the photoresist layer 20 as a mask to form the high polyload region 18a. The dosage and the energy of the first ion implantation is about 1E14 to 1E15 atoms/cm$^2$, 60 to 80 KeV, respectively. Then, the first photoresist layer 18 is stripped away.

As shown in FIG. 9, a second photoresist 22 is patterned on the polysilicon layer to cover the high resistance polysilicon region 18a. A second implantation is subsequently used to dope ions into the exposed region of the first polysilicon layer 18. Therefore, a low resistance polysilicon region 18b is created. The dosage of the second ion implantation is about 1E14 to 1E15 atoms/cm$^2$. The energy of the implantation is in the range of about 60 to 80 KeV. Similarly, the second photoresist 22 is removed after the low resistance polysilicon region 18b is formed.

Refer now to FIG. 10, photolithography and etching processes are then used to separate the polysilicon layer 18 into two individual parts. That is, a high resistance polysilicon 18a and a low resistance polysilicon 18b.

Using either of the prior art methods, the method requires several masking steps.

SUMMARY OF THE INVENTION

A method for manufacturing a high resistance polysilicon and a low resistance polysilicon in an integrated circuit is disclosed. The method comprises the steps of: forming a first dielectric layer on a wafer for isolation; forming a first polysilicon layer on said first dielectric layer; patterning and etching said first polysilicon layer to form a conductive structure on said dielectric layer; forming a second dielectric layer on said conductive structure for isolation; forming a second polysilicon layer on said second dielectric layer; performing a first implantation to implant ions into said second polysilicon using blanket ion implantation; patterning and etching said second polysilicon layer, thereby separating said second polysilicon layer into a high resistance area and a low resistance area, the top surface of said low resistance area being raised from the top surface of said high resistance area; depositing a photoresist so as to cover said high resistance area and leaving said low resistance area exposed; performing a second implantation to implant ions into said low resistance area using said photoresist as a mask; and removing said photoresist.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
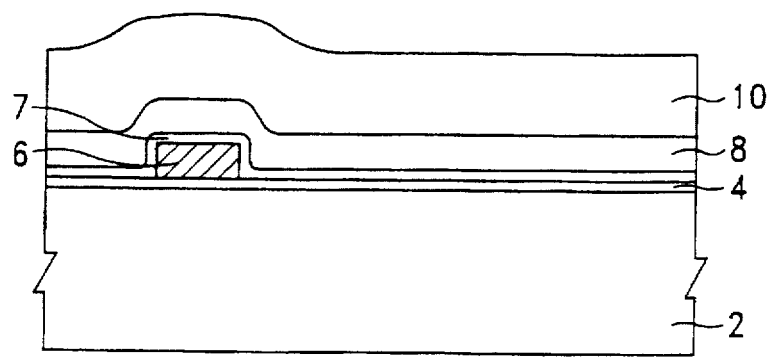
FIGS. 1–6 illustrate the steps in forming a mix-mode IC in accordance with a first prior art method.
Figure 2:
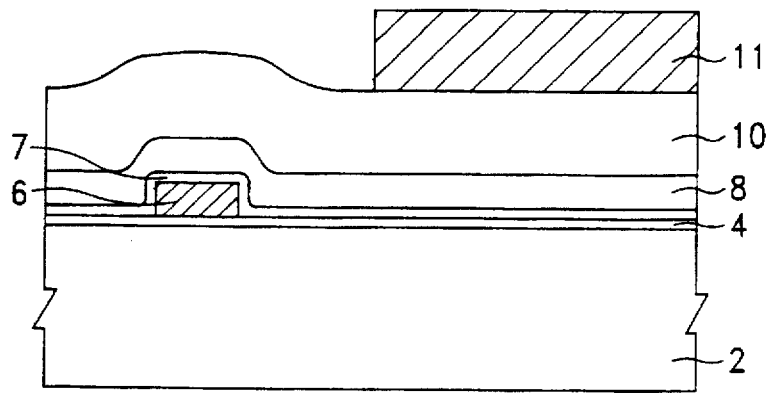
Figure 3:
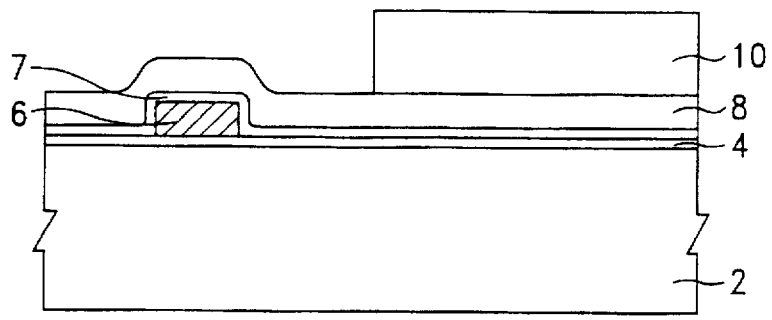
Figure 4:
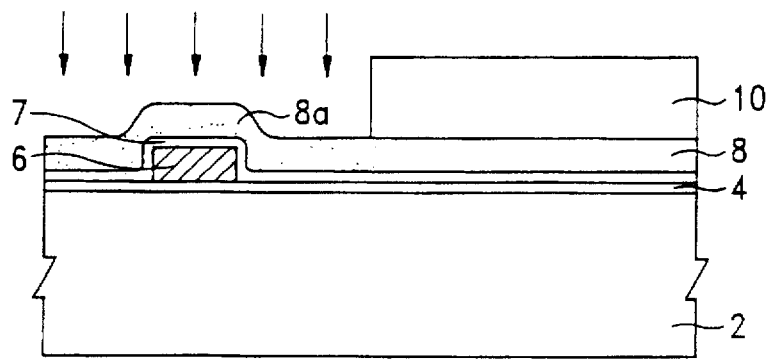
Figure 5:
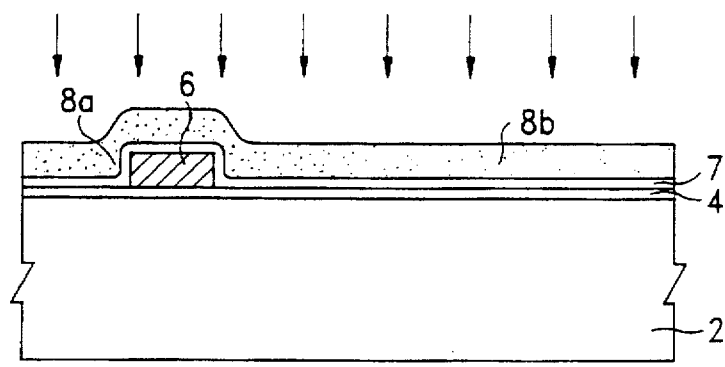
Figure 6:
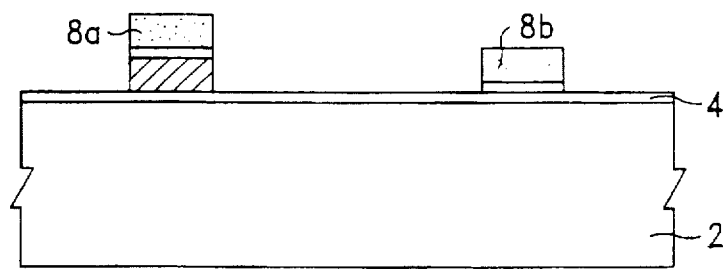
Figure 7:
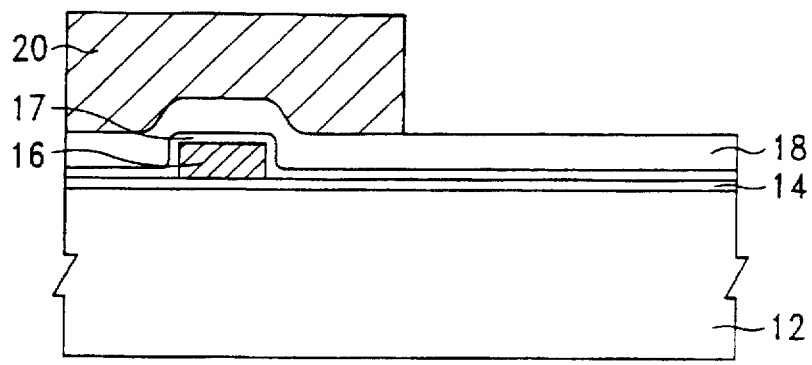
FIGS. 7–10 illustrate the steps in forming a mix-mode IC in accordance with a second prior art method.
Figure 8:
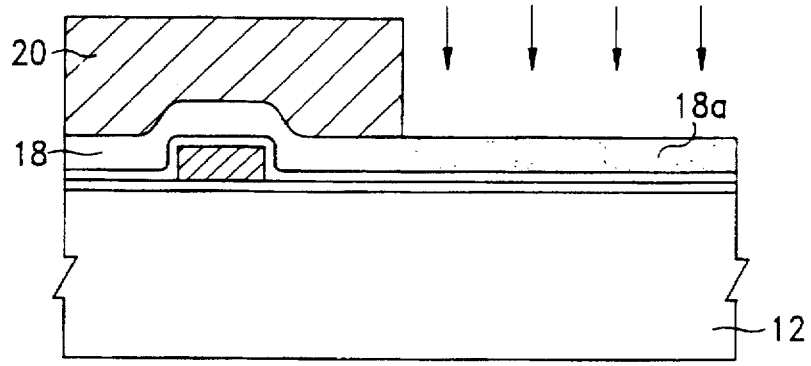
Figure 9:
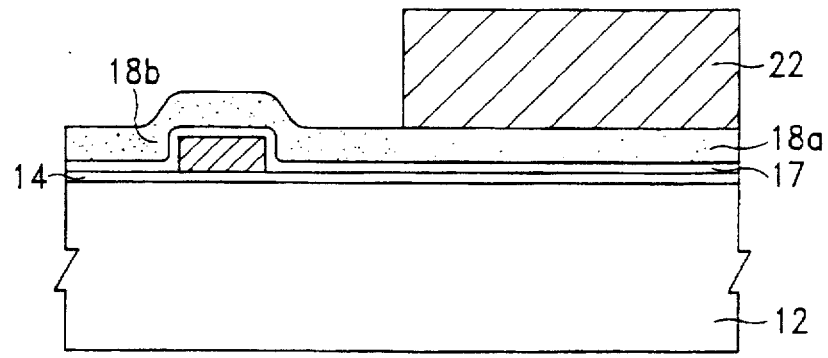
Figure 10:
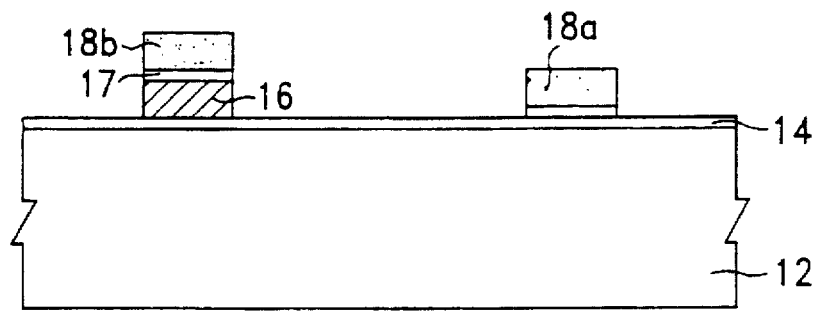
Figure 11:
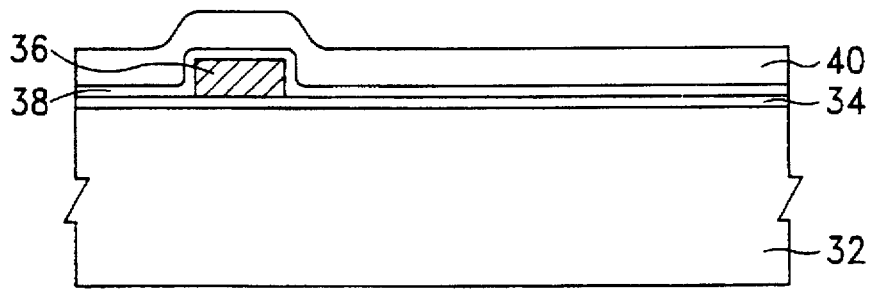
FIG. 11 is a cross section view of a semiconductor wafer illustrating the step of forming a second polysilicon layer over a substrate in accordance with the present invention.

Referring to FIG. 11, a single crystal P-type substrate 32 with a <100> crystallographic orientation is used for the preferred embodiment. A silicon oxide layer 34 is created atop the substrate 32 for use as an isolation layer. For example, the isolation layer may be a gate oxide of a transistor. In the preferred embodiment, the silicon dioxide layer 34 is formed by thermal oxidation using an oxygen-steam ambient, at a temperature between about 850° to 1000° C. Alternatively, the isolation layer 34 may be formed using other known oxide chemical compositions and procedures. For example, the silicon oxide layer 34 can be formed by using chemical vapor deposition (CVD) process, using TEOS (tetraethylorthosilicate) as a source at a temperature between about 650° to 750° C. In the preferred embodiment, the thickness of the silicon dioxide layer 34 is approximately 50–200 angstroms.

Still referring to FIG. 11, after the silicon oxide layer 34 is formed, a first polysilicon layer 36 is patterned over the silicon oxide layer 34. The polysilicon layer may be used as a conductive element of a device. For example, a gate electrode of a transistor. In the preferred embodiment, the first polysilicon structure 36 is formed by using conventional chemical vapor deposition (CVD) to have a thickness of about 2000–4000 angstroms. The formation of the first polysilicon layer 36 is not the feature of the present invention. Thus, only a cursory description of the formation of the device structure is given here.

A dielectric layer 38 for isolation is then formed on the first polysilicon structure 36. The dielectric layer is preferably formed of silicon oxide. A second polysilicon layer 40 is subsequently deposited on the dielectric layer 38. The second polysilicon layer 40 has a thickness in the range of about 3000 angstroms. Similarly, the second polysilicon layer 40 is formed by using chemical vapor deposition.

Figure 12:
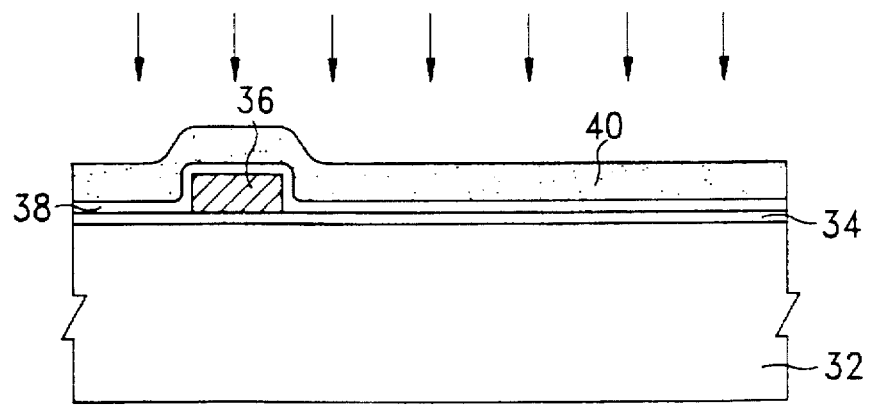
FIG. 12 is a cross section view of a semiconductor wafer illustrating the step of performing a first ion implantation in accordance with the present invention.

Turning next to FIG. 12, a blanket ion implantation is performed to implant ions into the entire second polysilicon layer 40. The dosage of the ion implantation is about 1E13 to 1E15 atoms/cm$^2$. The energy of the implantation is in the range of about 60 to 80 KeV. Thus, the resistance of the polysilicon layer is about 2000 ohms/square.

Figure 13:
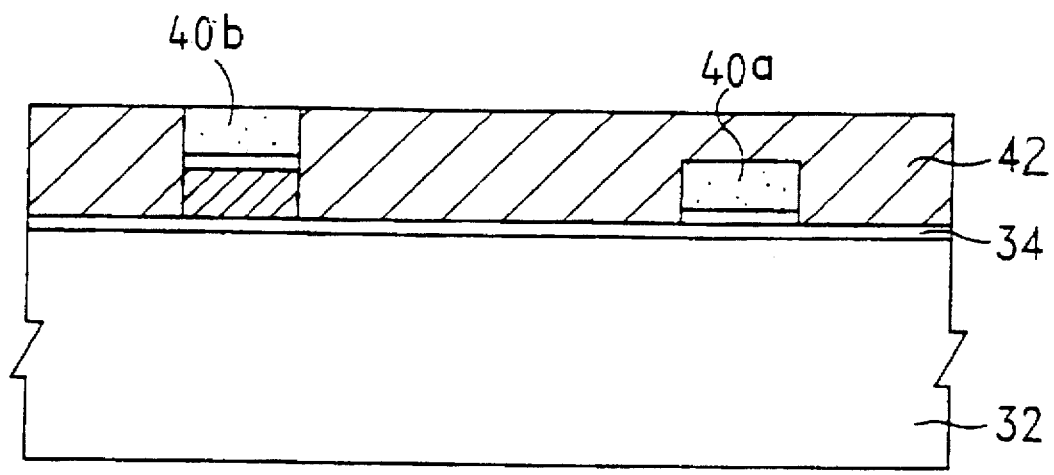
FIG. 13 is a cross section view of a semiconductor wafer illustrating the step of patterning a photoresist on the second polysilicon layer in accordance with the present invention.

Referring to FIG. 13, the second polysilicon layer 40 is then separated into a high resistance area 40a and a low resistance area 40b by using standard photolithography, masking, and etching processes. Then, a photoresist layer 42 is deposited onto the entire structure. Because of the previous process steps, the low resistance area 40b top surface is raised higher than the high resistance area 40a. The photoresist layer 42 is formed on the polysilicon areas 40a, 40b and on the substrate 32. The photoresist layer 42 is subsequently etched back to the top surface of the low resistance area 40b. Because of the fact that the low resistance area 40b is higher than the high resistance area 40a, the photoresist layer 42 remains on top of the high resistance area 40a and acts as an implant mask.

Figure 14:
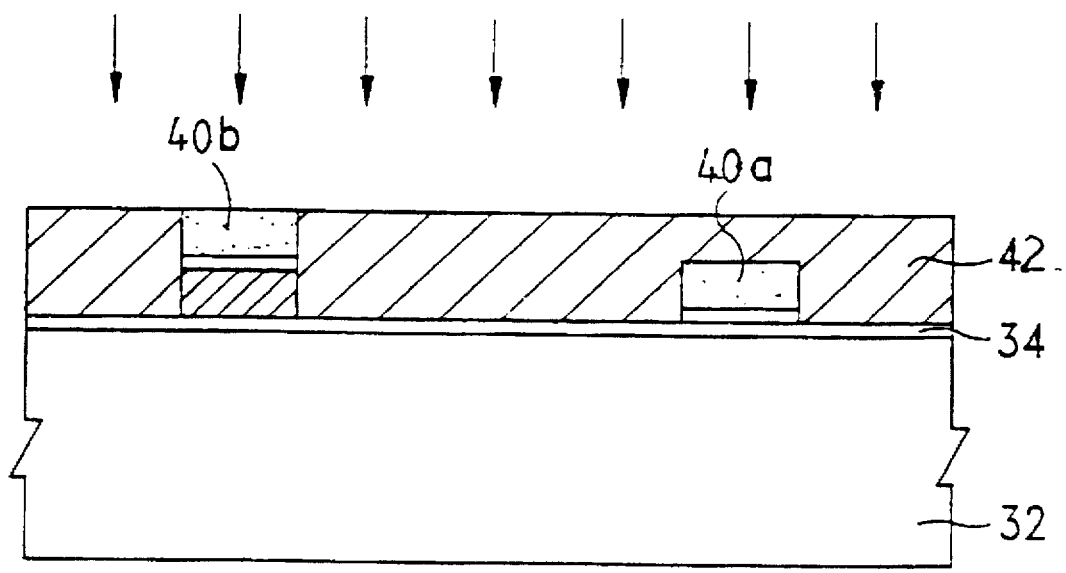
FIG. 14 is a cross section view of a semiconductor wafer illustrating the step of performing a second ion implantation in accordance with the present invention.

As shown in FIG. 14, a second implant is done on the low resistance area 40b, while the high resistance area is masked by the photoresist layer 42. Preferably, the dosage and the energy of the ion implantation are respectively about 1E14 to 1E15 atoms/cm$^2$ and 60 to 80 KeV, thereby forming a low resistance polysilicon 40b having resistivity about 60 ohm/square. Finally, the photoresist layer 42 is stripped away. Alternatively, the photolithography and etching processes used to separate the polysilicon can be done after the photoresist is removed.

As is understood by a person skilled in the art, the foregoing preferred embodiment of the present invention are illustrated of the present invention rather than limiting of the present invention. For example, the step to separate the second polysilicon can be done after the first ion implantation or after the photoresist used to form low resistance polysilicon is removed. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for manufacturing a high resistance polysilicon and a low resistance polysilicon in an integrated circuit, the method comprising the steps of:

forming a first dielectric layer on a wafer for isolation;

forming a first polysilicon layer on said first dielectric layer;

patterning said first polysilicon layer to form a conductive structure on said first dielectric layer;

forming a second dielectric layer on said conductive structure for isolation;

forming a second polysilicon layer on said second dielectric layer;

performing a first implantation to implant ions into said second polysilicon layer using blanket ion implantation said ions penetrating the entire second polysilicon layer;

patterning said second polysilicon layer, thereby separating said second polysilicon layer into a high resistance area and a low resistance area, the top surface of said low resistance area being raised from the top surface of said high resistance area;

depositing a photoresist so as to cover said high resistance area and leaving only the top surface of said low resistance area exposed;

performing a second implantation to implant ions into said low resistance area using said photoresist as a mask; and removing said photoresist.

2. The method of claim 1 wherein the step of depositing said photoresist comprises the steps of:

forming a photoresist on said second polysilicon layer and over said wafer; and etching back said photoresist to the surface of said low resistance area, a portion of said photoresist remaining on top of said high resistance area and acting as an implant mask.

3. The method of claim 1, wherein the dosage of said first implantation is about 1E13 to 1E15 atoms/cm$^2$.

4. The method of claim 3, wherein the energy of said first implantation is in the range of about 60 to 80 KeV.

5. The method of claim 1, wherein the dosage of said second implantation is about 1E14 to 1E15 atoms/cm$^2$.

6. The method of claim 5, wherein the energy of said second implantation is in the range of about 60 to 80 KeV.

7. The method of claim 1, wherein said first polysilicon layer has a thickness about 2000 to 4000 angstroms.

8. The method of claim 1, wherein said second polysilicon layer has a thickness about 2000 to 4000 angstroms.

9. A method for manufacturing mix-mode integrated circuit, the method comprising the steps of:

forming a first dielectric layer on a wafer for isolation;

forming a first polysilicon layer on said first dielectric layer;

patterning said first polysilicon layer to form a conductive structure on said first dielectric layer;

forming a second dielectric layer on said conductive structure and said wafer;

forming a second polysilicon layer on said second dielectric layer;

performing a first implantation to implant ions into said second polysilicon layer using blanket ion implantation said ions penetrating the entire second polysilicon layer;

forming a photoresist on said second polysilicon layer and over said wafer after performing the first implantation;

etching back said photoresist to expose only a top portion of said second polysilicon layer that is over said conductive structure, a portion of said photoresist remaining on top of said second polysilicon layer and acting as an implant mask in all areas other than said conductive structure;

performing a second implantation to implant ions into said exposed top portion of said second polysilicon layer using said remaining photoresist as a mask;

then, removing said remaining photoresist; and patterning said second polysilicon layer, thereby separating said second polysilicon layer into a high resistance area and a low resistance area, said low resistance area top surface being raised higher than said high resistance area.

10. The method of claim 9, wherein the dosage of said first implantation is about 1E13 to 1E15 atoms/cm$^2$.

11. The method of claim 10, wherein the energy of said first implantation is in the range of about 60 to 80 KeV.

12. The method of claim 11, wherein the dosage of said second implantation is about 1E14 to 1E15 atoms/cm$^2$.

13. The method of claim 12, wherein the energy of said second implantation is in the range of about 60 to 80 KeV.

14. The method of claim 9, wherein said first polysilicon layer has a thickness about 2000 to 4000 angstroms.

15. The method of claim 9, wherein said second polysilicon layer has a thickness about 2000 to 4000 angstroms.

* * * * *